United States Patent
Chen et al.

(10) Patent No.: US 12,154,768 B2
(45) Date of Patent: Nov. 26, 2024

(54) SURFACE PROCESSING EQUIPMENT AND SURFACE PROCESSING METHOD

(71) Applicant: Industrial Technology Research Institute, Hsinchu (TW)

(72) Inventors: Chih-Chieh Chen, Taoyuan (TW); Chih-Chiang Weng, Taoyuan (TW); Yo-Sung Lee, New Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 871 days.

(21) Appl. No.: 17/134,261

(22) Filed: Dec. 26, 2020

(65) Prior Publication Data

US 2022/0208533 A1    Jun. 30, 2022

(51) Int. Cl.
*H01J 37/32* (2006.01)
*B23K 10/00* (2006.01)
(Continued)

(52) U.S. Cl.
CPC ...... *H01J 37/32963* (2013.01); *B23K 10/003* (2013.01); *B29D 11/00009* (2013.01);
(Continued)

(58) Field of Classification Search
CPC ........... H01J 37/32963; H01J 37/32715; H01J 37/3244; H01J 37/32449
See application file for complete search history.

(56) References Cited

U.S. PATENT DOCUMENTS 5,504,303 A    4/1996    Nagy
7,591,957 B2   9/2009    Carr
(Continued)

FOREIGN PATENT DOCUMENTS

CN    100400225    7/2008
CN    101261511    9/2008
(Continued)

OTHER PUBLICATIONS

"Office Action of Taiwan Counterpart Application", issued on Nov. 26, 2021, pp. 1-3.
(Continued)

*Primary Examiner* — S. Behrooz Ghorishi
*Assistant Examiner* — Alexander A Wang
(74) *Attorney, Agent, or Firm* — JCIPRNET

(57) ABSTRACT

A surface processing equipment using energy beam including a multi-axis platform, a surface profile measuring device, an energy beam generator and a computing device is provided. The multi-axis platform is configured to carry a workpiece and move the workpiece to the first position or the second position. The surface profile measuring device has a working area, and the first position is located on the working area. The surface profile measuring device is configured to measure the workpiece to obtain surface profile. The energy beam generator is configured to provide an energy beam to the workpiece for processing, and the second position is located on a transmission path of the energy beam. The computing device is connected to the surface profile measuring device and the energy beam generator. The computing device adjusts the energy beam generator according to the error profile.

9 Claims, 8 Drawing Sheets

(51) Int. Cl.
  *B29D 11/00* (2006.01)
  *G01B 5/20* (2006.01)
  *G01B 11/24* (2006.01)

(52) U.S. Cl.
  CPC ...... *B29D 11/0098* (2013.01); *H01J 37/3244* (2013.01); *H01J 37/32449* (2013.01); *H01J 37/32715* (2013.01); *H01J 37/32825* (2013.01); *G01B 5/20* (2013.01); *G01B 11/2441* (2013.01); *H01J 2237/20207* (2013.01); *H01J 2237/20214* (2013.01)

(56) References Cited

U.S. PATENT DOCUMENTS

| | | | |
|---|---|---|---|
| 7,959,490 B2 | 6/2011 | Sutton | |
| 2006/0180581 A1* | 8/2006 | Swaringen | B23K 26/04 700/166 |
| 2008/0217305 A1* | 9/2008 | Sanders | H05H 1/28 219/121.52 |
| 2021/0313155 A1* | 10/2021 | Takikawa | H01J 37/32449 |

FOREIGN PATENT DOCUMENTS

| | | |
|---|---|---|
| CN | 101352826 | 1/2011 |
| CN | 105328535 | 2/2016 |
| CN | 106181741 | 12/2016 |
| CN | 105772946 | 1/2018 |
| CN | 110405621 | 11/2019 |
| CN | 108356712 | 1/2020 |
| TW | 200744968 | 12/2007 |
| TW | 202001977 | 1/2020 |
| TW | M595755 | 5/2020 |

OTHER PUBLICATIONS

Hongyu Li, et al., "Study of weighted space deconvolution algorithm in computer controlled optical surfacing formation," Chinese Optics Letters, vol. 7, Jul. 2009, pp. 627-631.

Hui Fang, et al., "Dwell function algorithm in fluid jet polishing," Applied Optics, vol. 45, Jun. 2006, pp. 4291-4296.

Hideo Takino, et al., "Computer numerically controlled plasma chemical vaporization machining with a pipe electrode for optical fabrication," Applied Optics, vol. 37, Aug. 1998, pp. 5198-5210.

Zhichao Dong, et al., "Modified dwell time optimization model and its applications in subaperture polishing," Applied Optics, vol. 53, May 2014, pp. 3213-3224.

Wenlin Liao, et al., "Mathematical modeling and application of removal functions during deterministic ion beam figuring of optical surfaces. Part 1: Mathematical modeling," Applied Optics, vol. 53, Jul. 2014, pp. 4266-4274.

Wenlin Liao, et al., "Mathematical modeling and application of removal functions during deterministic ion beam figuring of optical surfaces. Part 2: application," Applied Optics, vol. 53, Jul. 2014, pp. 4275-4281.

"Office Action of Taiwan Counterpart Application", issued on Dec. 22, 2022, p. 1-p. 8.

* cited by examiner

240

SURFACE PROCESSING EQUIPMENT AND SURFACE PROCESSING METHOD

BACKGROUND

Technical Field

The disclosure relates to a processing equipment and a processing method, and more particular, relates to a surface processing equipment and a surface processing method.

Description of Related Art

In the existing surface figuring field, the current figuring methods can be divided into a traditional full aperture figuring and a non-traditional local figuring. The traditional full aperture figuring is usually used in major German and American factories. High-precision requirements and a local figuring are usually achieved by MRF (Magnetorheological Finishing) or IBF (Ion Beam Figuring) techniques.

The principle of IBF is to bombard and remove atoms on the surface of the lens with a high-energy ion beam. Because an irregularity of 0.02λ can be reached as the amount of removal is at the atomic scale, IBF is mainly used in satellites and military equipment. However, the amount of removal at the atomic scale requires a long processing time, a process environment in a vacuum environment and a high cost of building equipment. Therefore, IBF still stays in academic units and research institutions. MRF has a higher production efficiency than IBF and can achieve an irregularity of 0.05. However, since the construction cost of the equipment is still dozens of times higher than the traditional one, MRF cannot be applied to mass production lines. Also, the required ferrofluid is micron scale particles with high magnetic permeability, which are prone to rust due to oxidation, and the polishing liquid cannot be recycled. In addition, the two polishing processes described above do not have an integrated surface profile detection system, and instead, micro areas are removed from the surface of the element as marking points for processing coordinate correction after the element is measured in an offline manner.

Therefore, how to integrate the polishing system with the detection system online and use an energy beam to perform the etching and removal of the lens surface to achieve high precision and reduce irregularities is what the field needs to focus on.

SUMMARY

The disclosure provides a surface processing equipment and a surface processing method.

The disclosure provides a surface processing equipment using energy beam, which includes a multi-axis platform, a surface profile measuring device, an energy beam generator and a computing device. The multi-axis platform is configured to carry a workpiece and move the workpiece to the first position or the second position. The surface profile measuring device has a working area, and the first position is located on the working area. The surface profile measuring device is configured to measure the workpiece to obtain a surface profile. The energy beam generator is configured to provide an energy beam to the workpiece for processing, and the second position is located on a transmission path of the energy beam. The computing device is electrically connected to the surface profile measuring device and energy beam generator. The computer-based computing device adjusts the parameters of energy beam generator based on surface topography variation compared to the define/target surface, i.e., error profile.

The disclosure further provides a surface processing method using energy beam, which includes: providing a surface processing equipment including a multi-axis platform, a surface profile measuring device, an energy beam generator and a computing device, the energy beam generator being configured to provide an energy beam; disposing a workpiece on the multi-axis platform; measuring the workpiece to obtain a surface profile; adjusting the energy beam generator according to the error profile; and providing the energy beam to perform a processing on the workpiece.

Based on the above, in the surface processing equipment and the surface processing method of the disclosure, the surface processing equipment includes the multi-axis platform, the surface processing equipment, the energy beam generator and the computing device. The multi-axis platform is configured to carry the workpiece and move the workpiece to the first position or the second position to perform the surface shape measurement or the processing. The surface profile measuring device is configured to measure the surface the workpiece to obtain a surface profile. The energy beam generator is configured to provide the energy beam for processing. The computing device adjusts the energy beam generator according to the error profile. In this way, the surface profile of the workpiece can be processed in the non-contact manner, such as the surface figuring and an operating parameter of the energy beam generator can be adjusted according to the surface profile obtained by the surface profile measurement.

To make the aforementioned more comprehensible, several embodiments accompanied with drawings are described in detail as follows.

DETAILED DESCRIPTION

Figure 1A:
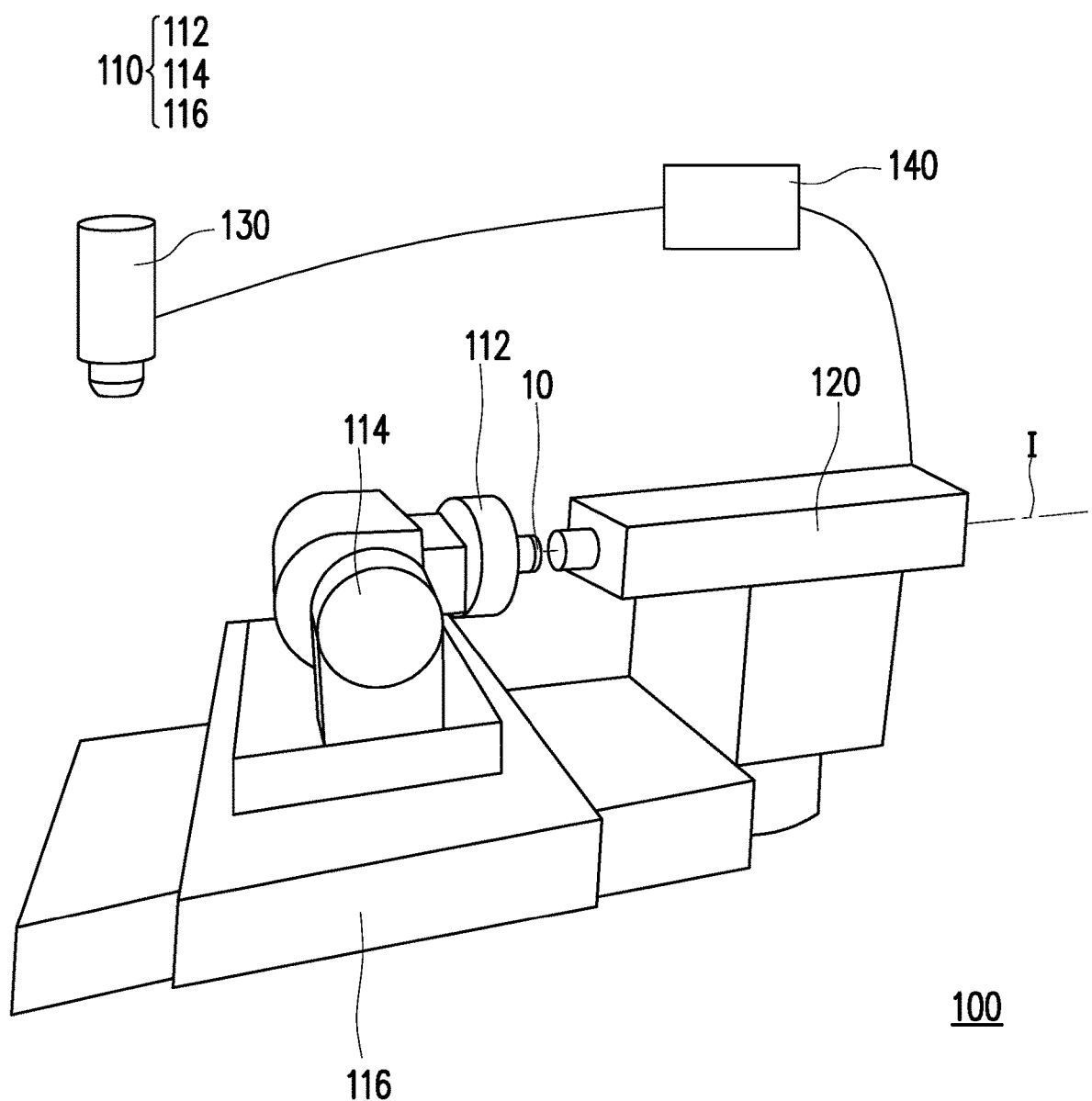
FIG. 1A and FIG. 1B are schematic views of a surface processing equipment in different states according to an embodiment of the disclosure.
Figure 1B:
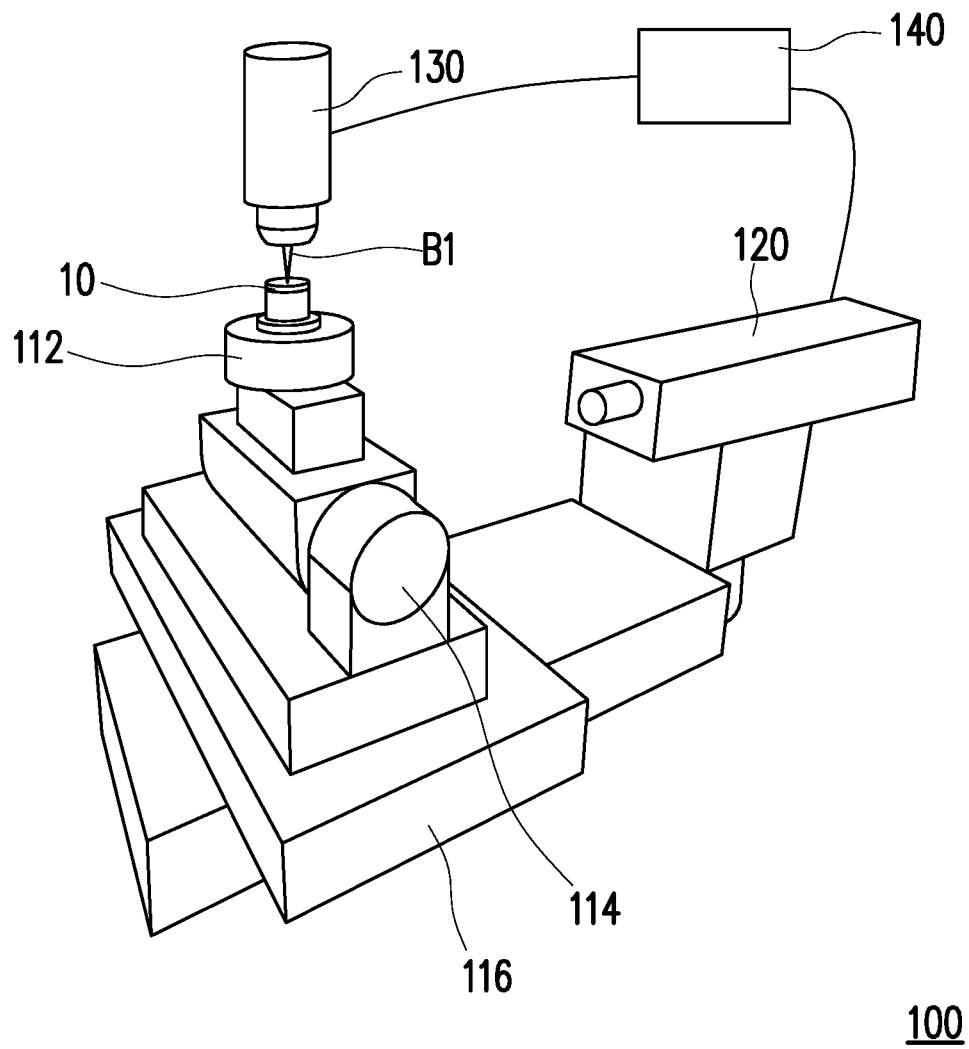

FIG. 1A and FIG. 1B are schematic views of a surface processing equipment in different states according to an embodiment of the disclosure. Referring to FIG. 1A and FIG. 1B, this embodiment provides a surface processing equipment 100, which includes a multi-axis platform 110, a surface profile measuring device 120, an energy beam generator 130 and a computing device 140. The surface processing equipment 100 is configured to perform a processing on a workpiece 10. Specifically, the workpiece 10 is, for example, an optical lens, and the surface processing equipment 100 is used to perform a surface processing process (e.g., polishing, grinding and the like) on the workpiece 10. Compared with traditional processing equipment, the surface processing equipment 100 of this embodiment is a processing equipment that performs a surface profile measuring on the surface of the workpiece 10 in a non-contact manner and uses an energy beam B1 to perform a surface figuring on the workpiece 10.

The multi-axis platform 110 is configured to carry the workpiece 10 and move the workpiece 10. Specifically, the multi-axis platform 110 includes a carrier 112, rotary stages 114 and linear stages 116. The carrier 112 is configured to fix the workpiece 10, and the rotary stages 114 are configured to rotate the carrier 112 to make the carrier 112 facing the surface profile measuring device 120 or making the carrier 112 facing the energy beam generator 130 (which are respectively shown by FIG. 1A and FIG. 1B). More specifically, in the schematic view shown by FIG. 1A, the multi-axis platform 110 can move (i.e., rotate) the carrier 112 carrying the workpiece 10 through the rotary stages 114 so that the carrier 112 faces the surface profile measuring device 120. In the schematic view shown by FIG. 1B, the multi-axis platform 110 can rotate the carrier 112 through the rotary stages 114 so that the carrier 112 faces the energy beam generator 130. The multi-axis platform 110 can move the carrier 112 carrying the workpiece 10 through the linear stages 116 to a position close to the surface profile measuring device 120 or a position close to the energy beam generator 130.

In other words, the multi-axis platform 110 carries the workpiece 10 and moves the workpiece 10 to a first position or a second position. The first position is a working position of the surface profile measuring device 120, and the second position is a working position of the energy beam generator 130. Accordingly, in this embodiment, the multi-axis platform 110 can be used to move the workpiece 10 to switch between the process of measuring surface profile and the process of performing a surface processing. In some embodiments, the multi-axis platform 110 further includes a tilting mechanism configured to tilt the carrier 112. Therefore, the workpiece 10 of the carrier 112 can have more working dimensions relative to the surface profile measuring device 120 or the energy beam generator 130, but the disclosure is not limited thereto.

As shown in FIG. 1A, the surface profile measuring device 120 has an optical axis I (i.e. working area), and the first position described above is located on the optical axis I of the surface profile measuring device 120. The surface profile measuring device 120 is configured to measure the workpiece 10 to obtain the surface profile. For example, the surface profile measuring device 120 is an optical interferometer. The surface profile is, for example, height information at any position on the surface of the workpiece 10. Accordingly, when the multi-axis platform 110 moves the workpiece 10 to face the optical axis I of the surface profile measuring device 120, the surface profile measuring device 120 can perform an optical measurement on the workpiece 10 to measure the surface profile of the workpiece 10. In an embodiment, the surface profile measuring device 120 measures the height of the surface of the workpiece 10 at any position to obtain the surface profile. In an embodiment, the surface profile measuring device 120 can also be a contact probe detection device, but the disclosure is not limited thereto.

Figure 2:
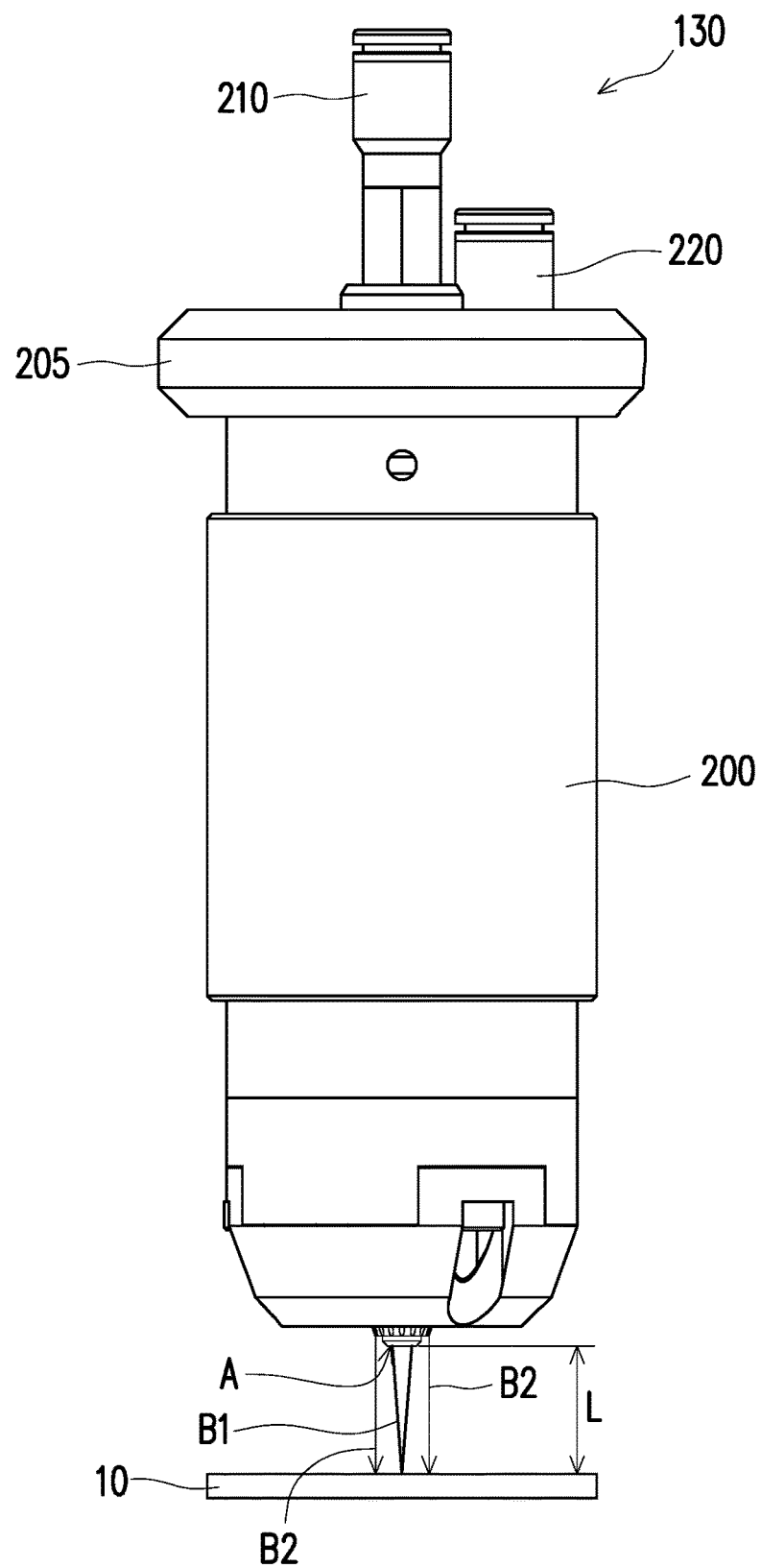
FIG. 2 is a 3D view of the energy beam generator of the surface processing equipment of FIG. 1A.

FIG. 2 is a 3D view of the energy beam generator of the surface processing equipment of FIG. 1A. Referring to FIG. 1A and FIG. 2, in this embodiment, the energy beam generator 130 is configured to provide the energy beam B1 to the workpiece 10, and the second position is located on a transmission path of the energy beam B1. The energy beam B1 is configured to perform the surface processing on the workpiece 10. The energy beam generator 130 has an exit surface A, and the energy beam B1 is transmitted from the exit surface A to the workpiece 10. A working distance L is provided between the exit surface A and the workpiece 10, and the working distance L is greater than 0. In other words, the processing method of this embodiment is a non-contact processing method. In addition, the processing method described above can be performed in a state where an ambient pressure is approximately a standard atmospheric pressure.

The computing device 140 is connected to the surface profile measuring device 120 and the energy beam generator 130. The computing device 140 adjusts the energy beam generator 130 according to the surface profile of the workpiece 10 measured by the surface profile measuring device 120. In this embodiment, the computing device 140 is, for example, a central processing unit (CPU) or other programmable devices for general purpose or special purpose such as a microprocessor and a digital signal processor (DSP), a programmable controller, an application specific integrated circuit (ASIC) or other similar elements or a combination of above-mentioned elements, but the disclosure is not limited thereto. Accordingly, the working distance L or an output power of the energy beam B1 corresponding to different positions on a surface shape of the workpiece 10 is defined according to the surface profile. In other words, in this embodiment, the energy beam B1 can be adjusted according to the surface topography variation compared to the defined/target surface, i.e. error profile, of different position on the workpiece 10. Therefore, compared with the traditional method, this embodiment uses the dynamically adjusted energy beam B1 to process the surface of the workpiece, such as surface figuring.

Figure 3:
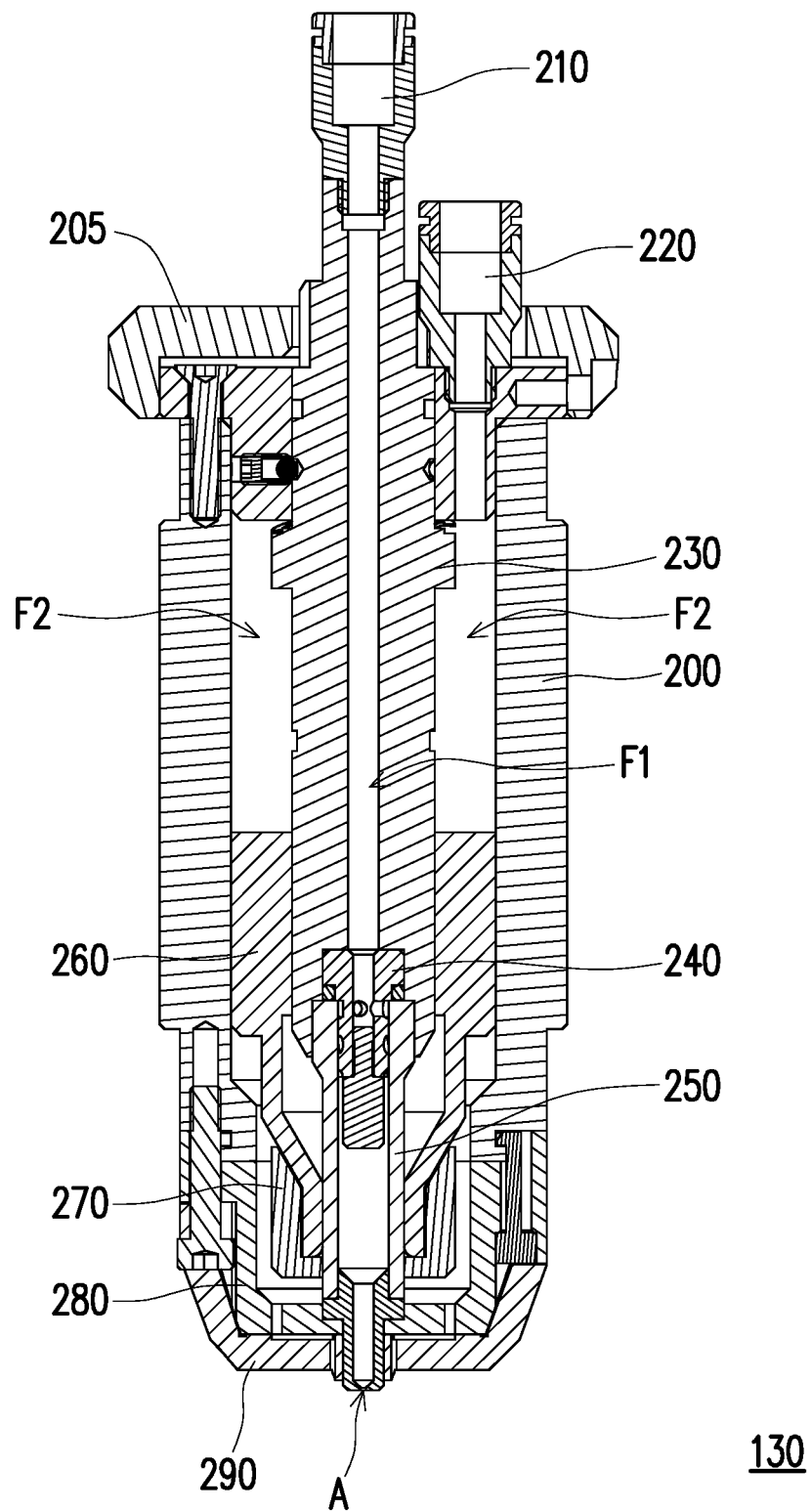
FIG. 3 is a cross-sectional view of the energy beam generator of the surface processing equipment of FIG. 1A.
Figure 4:
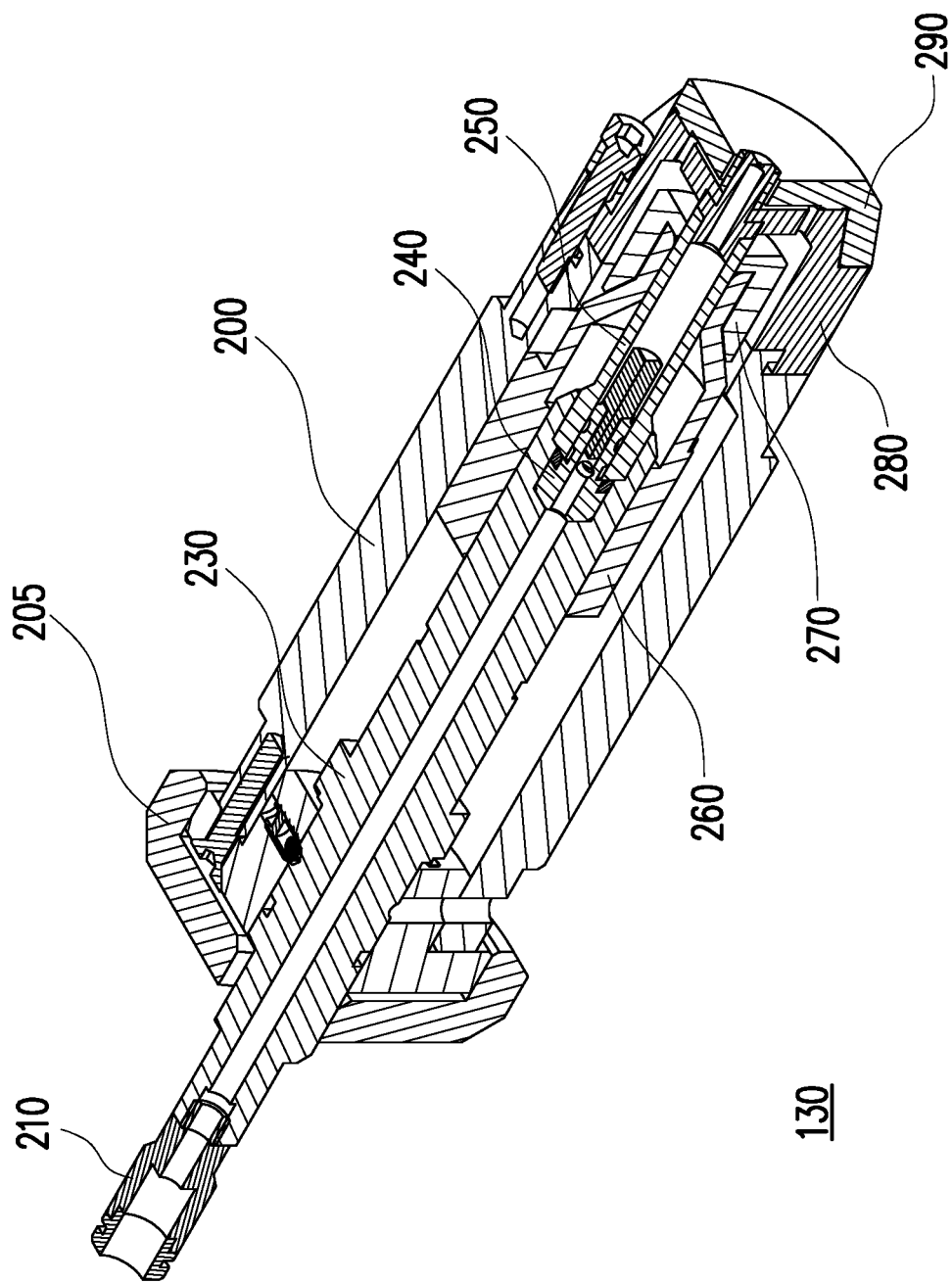
FIG. 4 is a 3D view of the energy beam generator of the surface processing equipment of FIG. 1A from another perspective.

FIG. 3 is a cross-sectional view of the energy beam generator of the surface processing equipment of FIG. 1A. FIG. 4 is a 3D cross-sectional view of the energy beam generator of the surface processing equipment of FIG. 1A from another perspective. Referring to FIG. 2 to FIG. 4, in details, in this embodiment, the energy beam generator 130 includes a housing 200, a first inlet 210, a second inlet 220 and a gas flow tube 230. Specifically, the energy beam generator 130 includes a top holder 205 assembled on the housing 200 and the gas flow tube 230. The first inlet 210 is connected to the gas flow tube 230 through the top holder 205, and the second inlet 220 is connected to a space between the gas flow tube 230 and the housing 200 through the top holder 205. The first inlet 210 is configured to inject a first gas, which can be emitted through the energy beam generator 130 to form the energy beam B1. The second inlet 220 is configured to inject a second gas, which can be emitted through the energy beam generator 130 to form a shielding zone B2. For example, the surface processing equipment 100 of this embodiment further includes a first gas source (not shown) and a second gas source (not shown). The first gas source can be a combination of a main gas and at least one reactive gas, and the second gas source can be an inert gas. For instance, the first gas provided by the first gas source is argon (Ar), carbon tetrafluoride ($CF_4$) and nitrogen ($N_2$). A combination ratio of the above-mentioned gases flowing into the first inlet 210 is controlled by a gas flow/quality controller. The second gas provided by the second gas source is, for example, nitrogen. Nonetheless, in a different embodiment, the gases respectively selected for the first gas source and the second gas source may be designed according to the material of the workpiece 10. The disclosure does not limit the type or the combination ratio of the first gas and the second gas.

The housing 200 surrounds the gas flow tube 230. An internal space of the gas flow tube 230 is a first flow path F1, and the first gas is transmitted along the first path F1. The space between the gas flow tube 230 and the housing 200 form a second flow path F2, and the second gas is transmitted along the second flow path F2. The first inlet 210 is communicating through the inner space of the gas flow tube 230 (i.e., the first flow path F1). The second inlet 220 is communicating through a space between the gas flow tube 230 and the housing 200 (i.e., the second flow path F2). Both inlets have corresponding outlets on the exit surface A. Accordingly, during the processing, the first gas provided by the first gas source of this embodiment flows into the first flow path F1 through the first inlet 210, and flows out from the center of the exit surface A to form the energy beam B1. The second gas provided by the second gas source of this embodiment flows into the second flow path F2 through the second inlet 220, and flows out from the periphery of the exit surface A corresponding to the outside of the gas flow tube 230 to form the shielding zone B2. In this way, the shielding zone B2 surrounds the energy beam B1 to form a gas layer with a controllable composition between the energy beam B1 and an external gas.

Figure 5:
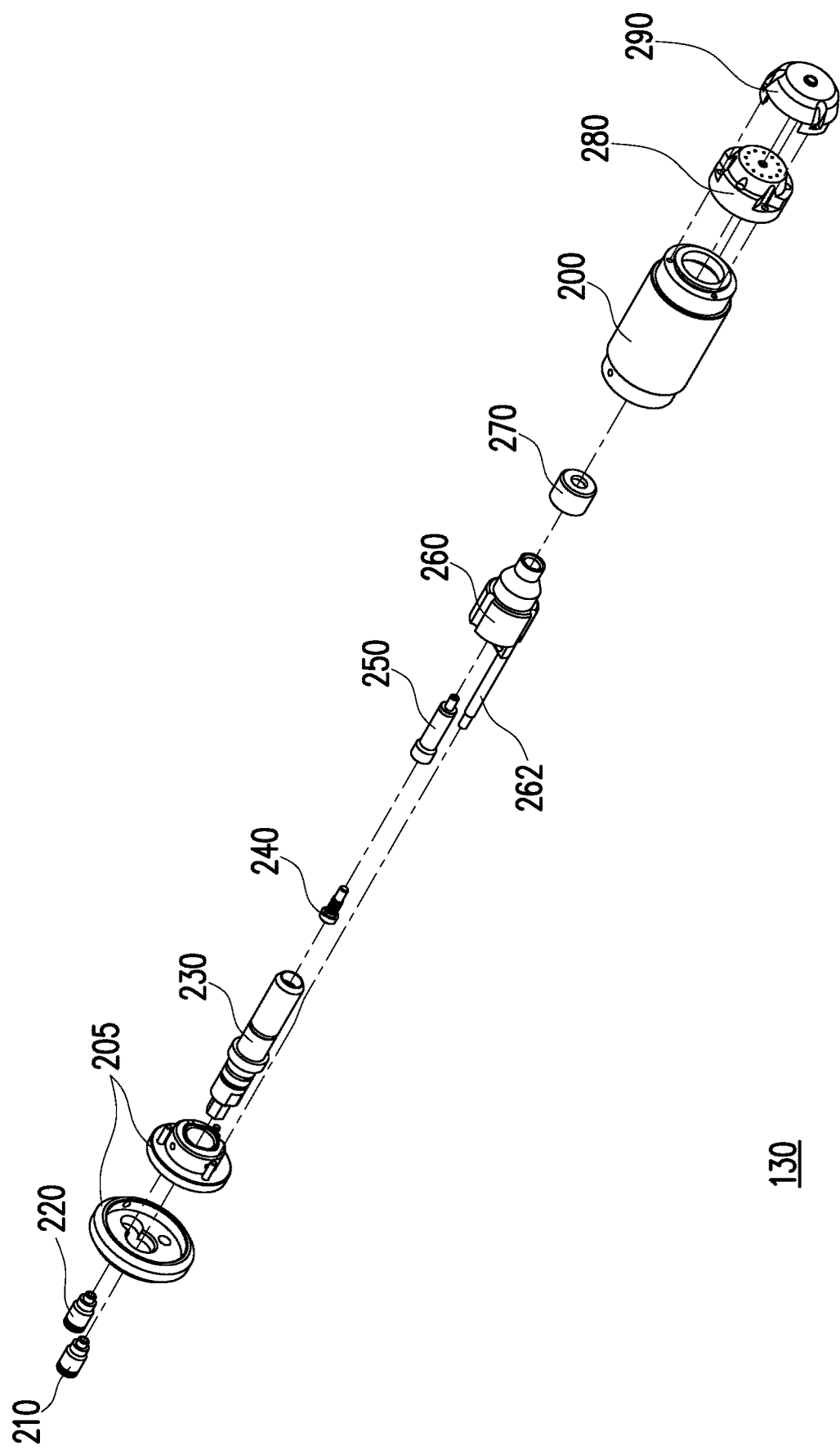
FIG. 5 is a 3D exploded view of the energy beam generator of the surface processing equipment of FIG. 1A.
Figure 6:
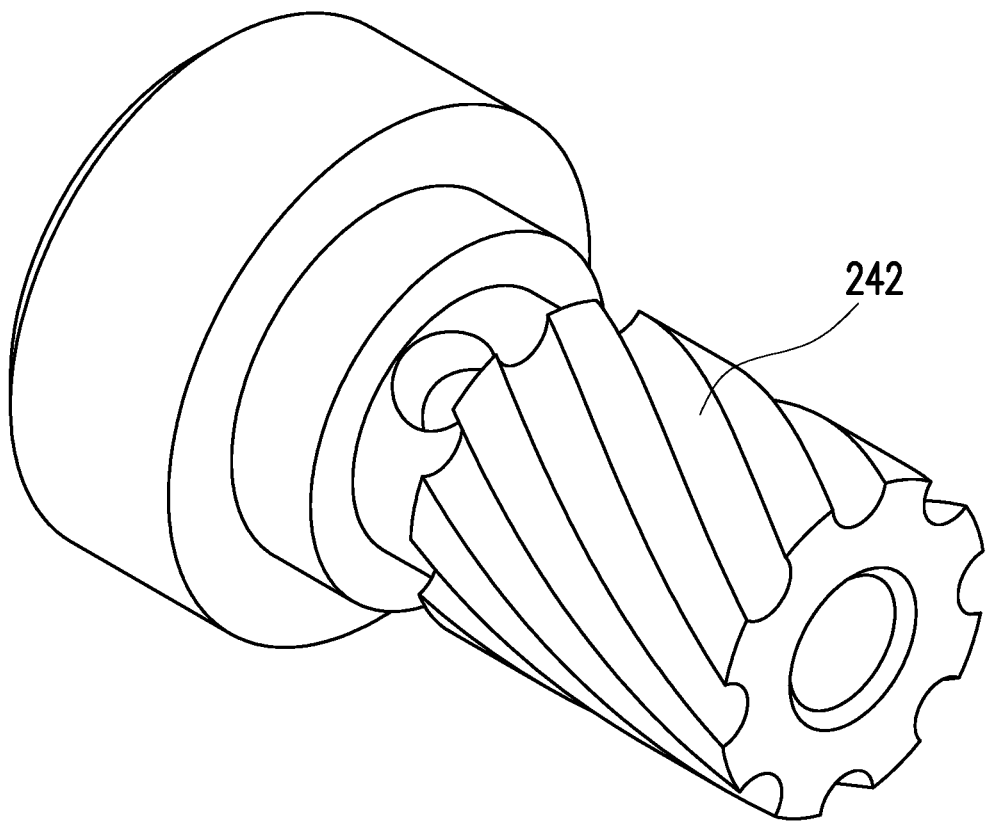
FIG. 6 is a 3D view of a micro gas mixing mechanism of the energy beam generator of FIG. 5.

FIG. 5 is a 3D exploded view of the energy beam generator of the surface processing equipment of FIG. 1A. FIG. 6 is a 3D view of a mixing mechanism of the energy beam generator of FIG. 5. Referring to FIG. 3 to FIG. 6, in an embodiment, the energy beam generator 130 further includes a micro gas mixing element 240, a beam concentrating element 250, a first electrode 260, an insulator 270, an electrode holder 280 and a second electrode 290. The micro gas mixing element 240 is disposed one side of the gas flow tube 230 facing the exit surface A, and the beam concentrating element 250 is disposed on one side of the micro gas mixing element 240 facing the exit surface A. In other words, the beam concentrating element 250 is located between the gas flow tube 230 and the micro gas mixing element 240. The micro gas mixing element 240 has a plurality of thread grooves 242 (as shown in FIG. 6) communicating through the gas flow tube 230. An inner wall of the beam concentrating element 250 and the thread grooves 242 form a plurality of gas micro flow paths.

Referring to FIG. 3 to FIG. 5, a first electrode 260 is a hollow cylinder structure covered on the beam concentrating element 250. The beam concentrating element 250 is located between the micro gas mixing element 240 and the first electrode 260. In this embodiment, an outer wall of the gas flow tube 230 has a male thread structure, and the first electrode 260 has a female thread structure adapted to the first electrode structure of the gas flow tube 230. Therefore, it is possible to move the first electrode 260 toward the top holder 205 or toward the second electrode 290 by rotating the gas flow tube 230 without disassembling the main body of the energy beam generator 130, so that a distance between the first electrode 260 and the second electrode 290 is changed to achieve the effect of adjustment. The second electrode 260 has an electronic guidance connector 262, and the electronic guidance connector 262 is made of a conductive material (e.g., copper). The electronic guidance connector 262 is connected to the first electrode 260 to protrude from the top holder 205, and serves as a connection point for an external radio frequency power supply (not shown).

The insulator 270, the electrode holder 280 and the second electrode 290 are disposed in sequence on one side of the first electrode 260 facing the exit surface A. In an embodiment, the first electrode 260 is used as a radio frequency electrode and the second electrode 290 is used as a ground electrode, so that the first gas flowing through is formed into plasma and the energy beam B1 in the plasma state is provided from the exit surface A. The insulator 270 has an anti-arc function, and is made of, for example, ceramic. The electrode holder 280 is made of a dielectric material (e.g., ceramic or polyetheretherketone (PEEK)), and can be combined with the top holder 205 and the housing 200 so that the elements form the first flow part F1 (i.e., the gas flow tube 230, the micro gas mixing element 240 and the beam concentrating element 250) are tightly connected to achieve an airtight function. The second electrode 290 can be combined with the housing 200 through the electrode holder 280. It is worth noting that, in this embodiment, there is a space between the first electrode 260 and the housing 200, and a flow path is disposed on the electrode holder 280. Therefore, the second gas flowing through the electrode holder 280 has a cooling function for the first electrode 260 and the second electrode 290.

Figure 7:
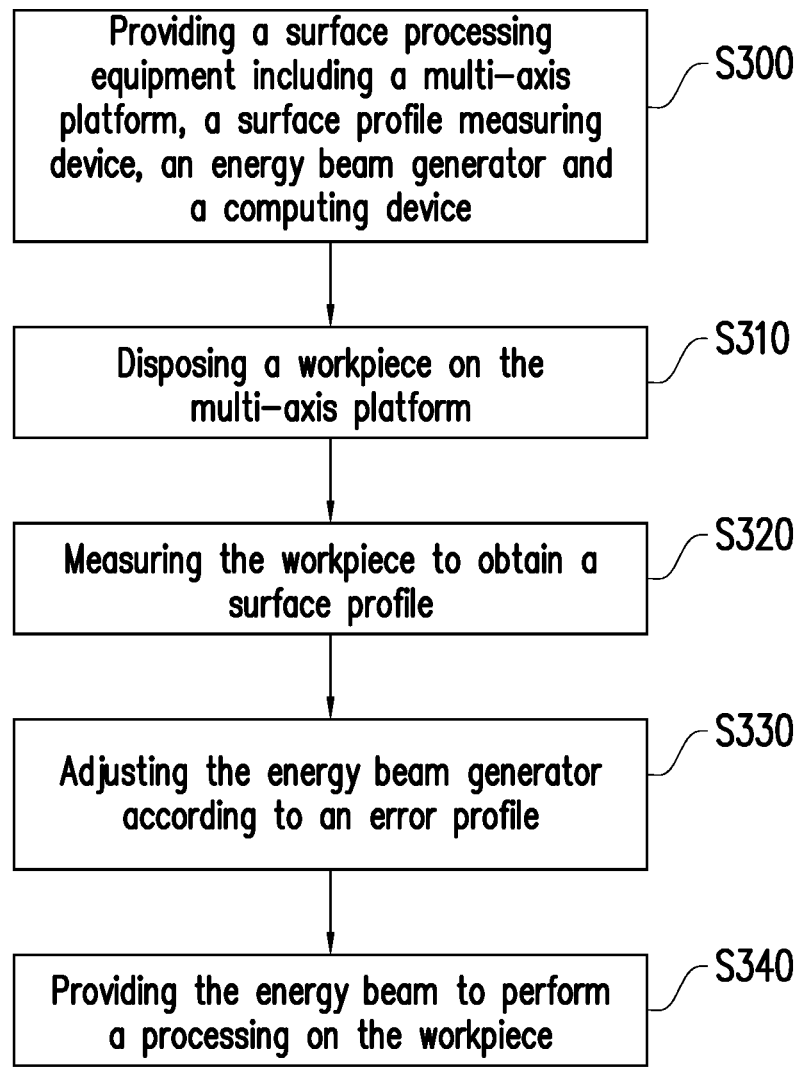
FIG. 7 is a flowchart illustrating steps in a surface processing method according to an embodiment of the disclosure.

FIG. 7 is a flowchart illustrating steps in a surface processing method according to an embodiment of the disclosure. Referring to FIG. 1A, FIG. 1B, FIG. 3 and FIG. 7, this embodiment provides a surface processing method using the energy beam B1, which is at least applicable to the surface processing equipment 100 and the energy beam generator 130 respectively shown in FIG. 1A, FIG. 1B and FIG. 3, but the disclosure is not limited thereto. In the surface processing method of this embodiment, first of all, step S300 is executed to provide the surface processing equipment 100. The surface processing equipment 100 includes the multi-axis platform 110, the surface profile measuring device 120, the energy beam generator 130 and the computing device 140. Here, the energy beam generator 130 is configured to provide the energy beam B1 to perform a processing on the workpiece 10.

Next, step S310 is executed to dispose the workpiece 10 on the multi-axis platform 110. Then, step S320 is executed to measure the workpiece 10 to obtain surface profile. Specifically, the multi-axis platform 110 is used to move the workpiece 10 to a first position. The first position is located on an optical axis I of the surface profile measuring device 120 so that the surface profile measuring device 120 can measure the workpiece 10 to obtain the surface profile of the workpiece 10. In an embodiment, the surface profile measuring device 120 measures the height of the surface of the workpiece 10 at any position to obtain the surface profile.

Next, step S330 is executed to adjust the energy beam generator 130 according to the error profile. Specifically, the computing device 140 adjusts the energy beam generator 130 according to the surface profile measured by the surface profile measuring device 120, and the computing device 140 has a pre-defined mathematical equation which can calculate and control the operation of the entire system. In detail, the step in which the energy beam generator 130 is adjusted according to the error profile may further include: a step of obtaining the pre-defined mathematical equation according to relationship pre-defined mathematical equation and the error profile, and a step of adjusting the energy beam generator 130 according to the execution information. The execution information include movement trajectory parameters, gas flow parameters, dwell time parameters, working distance parameters or power parameters of the energy beam generator 130.

In other words, in this embodiment, the energy beam B1 provided by the energy beam generator 130 can be adjusted according to the error profile of different position on the workpiece 10. Therefore, compared with the traditional method, this embodiment uses the dynamically adjusted energy beam B1 to process the surface of the workpiece, such as surface figuring.

For instance, according to the movement trajectory parameters, the dwell time parameters or the working distance parameters, the multi-axis platform 110 can adjust the relative position between the workpiece 10 and energy beam generator 130 in the different processing steps. The surface processing equipment 100 of this embodiment may further include the first gas source and the second gas source. The first gas source and the second gas source are configured to respectively provide the first gas and the second gas with proper ratio or flowrate to the energy beam generator 130 according to the gas flow parameters.

In an embodiment, the step in which the energy beam generator 130 is adjusted according to the surface profile further includes: a step of measuring a standard workpiece to obtain standard surface profile. In other words, before the processing is performed on the workpiece 10, the standard workpiece (i.e., a workpiece that does not need additional trimming) can be used to perform one surface profile measurement to obtain the standard surface profile. Next, the error profile is obtained according to the difference between surface profile obtained by measuring the workpiece 10 and the standard surface profile obtained by measuring the standard workpiece. Then, an error tolerance is set for the surface processing equipment 100 to maintain the accuracy of the subsequent processing process. Accordingly, after the processing process is performed, the computing device 140 can determine whether the error profile is overly large according to the level of error tolerance described above. For instance, if the surface shape difference is greater than the level of error tolerance the computing device 140 can control the multi-axis platform 110, the surface profile measuring device 120 and the energy beam generator 130 to perform the processing again according to the result of the above. If the error profile is less than the level of error tolerance, the processing is completed.

Lastly, step S340, the energy beam B1 is provided to process the workpiece 10. Specifically, the multi-axis platform 110 is used to move the workpiece 10 to a second position. The second position is located on a transmission path of the energy beam B1 so that the energy beam generator 130 can perform the processing process on the surface shape of the workpiece 10. In this way, this embodiment uses the dynamically adjusted energy beam B1 to perform the surface profile figuring.

In summary, in the surface processing equipment and the surface processing method of the disclosure, the surface processing equipment includes the multi-axis platform, the surface processing equipment, the energy beam generator and the computing device. The multi-axis platform is configured to carry the workpiece and move the workpiece to the first position or the second position to perform the surface profile measurement or the processing. The surface profile measuring device is configured to measure the surface the workpiece to obtain surface profile. The energy beam generator is configured to provide the energy beam to the workpiece for processing. The computing device adjusts the energy beam generator according to the error profile. In this way, the surface shape of the workpiece can be processed in the non-contact manner, such as the surface figuring, and an operating parameter of the energy beam generator can be adjusted according to the surface topography variation compared to the defined/target surface, i.e. error profile.

Although the disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A surface processing method using an energy beam, comprising:
    providing a surface processing equipment including a multi-axis platform, a surface profile measuring device, an energy beam generator, a computing device, a first gas source and a second gas source, the energy beam generator being configured to provide the energy beam, the first gas source connected to a first inlet of the energy beam generator and configured to provide a first gas, and the second gas source connected to a second inlet of the energy beam generator and configured to provide a second gas, wherein the energy beam generator comprises a gas flow tube, a housing and a micro gas mixing element, the housing is configured to surround the gas flow tube, an internal space of the gas flow tube is a first flow path, the first gas is transmitted along the first flow path, the gas flow tube and the housing form a second flow path, and the second gas is transmitted along the second flow path, the micro gas mixing element has a plurality of thread grooves communicating through the gas flow tube;
    disposing a workpiece on the multi-axis platform;
    measuring the workpiece to obtain a surface profile;
    adjusting the energy beam generator according to an error profile;
    emitting the first gas from the energy beam generator to form the energy beam to perform a processing on the workpiece;
    emitting the second gas from the energy beam generator to from a shielding zone to surround the energy beam to isolate the energy beam from an external gas.

2. The surface processing method of claim 1, further comprising:
    moving the workpiece to a first position, the first position being located on an optical path of the surface profile measuring device; and
    moving the workpiece to a second position, the second position being located on a transmission path of the energy beam.

3. The surface processing method of claim 1, wherein the computing device has a relationship pre-defined mathematical equation, and the step of adjusting the energy beam generator according to the error profile further comprises:
    obtaining execution information according to the relationship pre-defined mathematical equation and the error profile; and
    adjusting the energy beam generator according to the execution information.

4. The surface processing method using energy beam of claim 3, wherein the execution information comprise a movement trajectory parameter, gas flow parameters, dwell time parameters, working distance parameters or a power parameters of the energy beam generator.

5. The surface processing method using energy beam of claim 4, wherein the multi-axis platform moves the workpiece according to the movement trajectory parameters, the dwell time or the working distance parameters.

6. The surface processing method using energy beam of claim 4, wherein the first gas source and the second gas source are configured to respectively provide the first gas and the second gas to the energy beam generator according to the gas flow parameters.

7. The surface processing method of claim 1, wherein the step of adjusting the energy beam generator according to the error profile further comprises:
measuring a standard workpiece to obtain a standard surface profile;
obtaining the error profile according to the surface profile and the standard surface profile;
setting the level of error tolerance; and
determining the error profile according to the level of error tolerance, performing the processing again if the error profile is greater than the level of error tolerance, and completing the processing if the error profile is less than the level of error tolerance.

8. The surface processing method of claim 1, wherein the multi-axis platform configured to carry a workpiece and move the workpiece to a first position or a second position, the surface profile measuring device having a working area, the first position being located on the working area, the surface profile measuring device being configured to measure the workpiece to obtain a surface profile, the second position being located on a transmission path of the energy beam, and the computing device connected to the surface profile measuring device and the energy beam generator, wherein the computing device adjusts the energy beam generator and the multi-axis platform according to an error profile.

9. The surface processing method of claim 8, wherein a working distance or an output power of the energy beam corresponding to different positions on a surface of the workpiece is defined according to the error profile.

* * * * *